(12) United States Patent
Hechinger

(10) Patent No.: US 7,768,256 B2
(45) Date of Patent: Aug. 3, 2010

(54) METHOD AND DEVICE FOR SECURE MONITORING OF A DISTANCE

(75) Inventor: Martin Hechinger, Herbolzheim (DE)

(73) Assignee: Pilz GmbH & Co. KG, Ostfildern (DE)

( * ) Notice: Subject to any disclaimer, the term of this patent is extended or adjusted under 35 U.S.C. 154(b) by 0 days.

(21) Appl. No.: 12/349,063

(22) Filed: Jan. 6, 2009

(65) Prior Publication Data

US 2009/0219013 A1    Sep. 3, 2009

Related U.S. Application Data

(63) Continuation of application No. PCT/EP2007/005894, filed on Jul. 3, 2007.

(30) Foreign Application Priority Data

Jul. 7, 2006   (DE) ................. 10 2006 032 226

(51) Int. Cl.
*G01R 33/12*   (2006.01)
*G01B 7/14*   (2006.01)
*G01B 7/30*   (2006.01)

(52) U.S. Cl. .............. 324/207.15; 324/232; 324/207.17
(58) Field of Classification Search ............ 324/207.11, 324/207.15, 207.17, 232; 340/552, 561
See application file for complete search history.

(56) References Cited

U.S. PATENT DOCUMENTS

| 4,843,259 A | 6/1989 | Weisshaupt |
| 5,012,206 A | 4/1991 | Tigges |
| 6,130,489 A | 10/2000 | Heimlicher |
| 6,191,580 B1 | 2/2001 | Guichard |
| 6,409,083 B1 | 6/2002 | Link |
| 6,859,140 B2 * | 2/2005 | Schmidt .................. 340/552 |

FOREIGN PATENT DOCUMENTS

| DE | 37 34 177 A1 | 5/1988 |
| DE | 42 12 363 A1 | 10/1993 |
| DE | 195 38 575 A1 | 6/1997 |
| DE | 197 11 588 A1 | 9/1998 |
| DE | 102 22 186 C1 | 10/2003 |
| DE | 20 2004 015 944 U1 | 3/2006 |
| EP | 0 393 359 A2 | 10/1990 |
| EP | 0 936 740 A1 | 8/1999 |
| EP | 1 278 077 A2 | 1/2003 |
| EP | 1 289 147 A1 | 3/2003 |
| EP | 1 530 064 A1 | 5/2005 |

* cited by examiner

*Primary Examiner*—Reena Aurora
(74) *Attorney, Agent, or Firm*—Harness, Dickey & Pierce, P.L.C.

(57) ABSTRACT

The invention relates to a method for securely monitoring a distance between a metallic part and an inductive proximity sensor, in particular for monitoring a closed position of a guard door in an automated system, said method having the steps of: providing an oscillating circuit, providing a metallic part made of a first material, driving the oscillating circuit with at least one pulse, such that a decaying oscillation is generated which is dependent on a distance between the metallic part and the oscillating circuit and which has an actual frequency and an actual attenuation, and signaling whether both the actual frequency undershoots a predefined maximum frequency and the actual attenuation undershoots a predefined maximum attenuation. The invention also relates to a signaling device for monitoring a distance between a metallic part and an inductive proximity sensor.

12 Claims, 5 Drawing Sheets

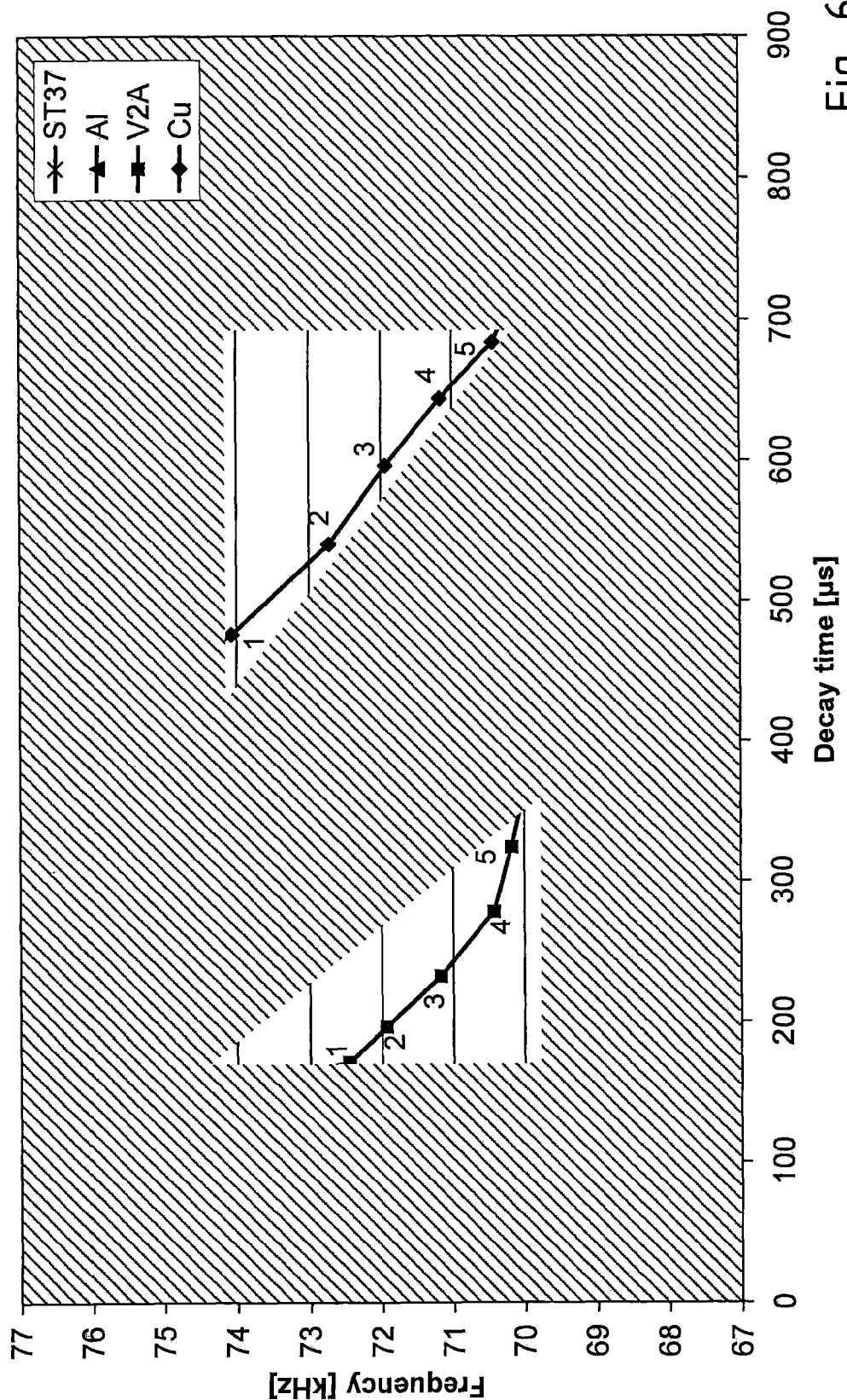

METHOD AND DEVICE FOR SECURE MONITORING OF A DISTANCE

CROSS REFERENCES TO RELATED APPLICATIONS

This application is a continuation of international patent application PCT/EP2007/005894, filed on Jul. 3, 2007 designating the U.S., which international patent application has been published in German language and claims priority from German patent application DE 10 2006 032 226, filed on Jul. 7, 2006. The entire contents of these priority applications are incorporated herein by reference.

BACKGROUND OF THE INVENTION

The present invention relates to a method for securely monitoring a distance between a metallic part and an inductive proximity sensor, in particular for monitoring a closed position of a guard door in an automated system.

The invention also relates to a signaling device for securely monitoring a distance between a metallic part and an inductive proximity sensor, in particular for monitoring a closed position of a guard door in an automated system.

In order to make safe a hazardous area of a system which operates in automated fashion, for example robots, presses or conveyor belts which operate in automated fashion, guard doors are often provided, which doors prevent the operator from coming into contact with those parts of the system which may be hazardous to the operator.

So that the guard door can fulfill its protective function, before starting the system it has to be verified that the guard door is properly closed. For this purpose, an inductive proximity sensor of the type described below may be used which checks whether the guard door is at a particular position. The system cannot be switched on as long as the required position of the guard door has not been reached.

The inductive proximity sensor operates according to the following principle. The proximity sensor contains an oscillating circuit which is caused to oscillate by means of a pulse. The oscillating circuit has a characteristic decaying oscillation if a metal to be detected is in the vicinity thereof. If the metal then approaches the proximity sensor, the attenuation and/or frequency of the decaying oscillation change(s).

However, the fact that the metal to be detected must be known in advance and the proximity sensor must be constructed in an appropriate manner gives rise to difficulties in this case. If, for example, the intention is to detect a particular distance both for aluminum (non-ferromagnetic) and for iron (ferromagnetic), either a reconfiguration or a very complex device for determining the material is required. Only after the material is known can the distance then be determined. Nevertheless, even in the case of a material detection, which can distinguish between ferromagnetic and non-ferromagnetic materials, problems remain in the case of metal alloys which have both ferromagnetic and non-ferromagnetic components.

In addition, it has been found in practice that the operations of opening and closing the guard door, for example, in order to clamp a workpiece, are found to be a nuisance by some operators. In the past, it has therefore been the case that operators have manipulated the safety device by fixing a piece of metal directly to the proximity sensor. In this case, the system could be operated even with the guard door open since the sensor incorrectly detected the piece of metal as a closed guard door.

In order to counteract such attempts at manipulation, it is desirable to determine or monitor the distance between a proximity sensor and a metallic counterpart in such a manner that the system is also not switched on or is switched off when the distance of the metal to be detected is too small.

DE 102 22 186 C1 discloses a safety switch having two transmitting/receiving elements. In this case, one element is fitted in a stationary manner, for example, while the other element is fastened to a guard door. In a first step, the first element transmits electromagnetic signals to the second element which is in the form of an LC-oscillating circuit. As a result, the second element is caused to oscillate and stores a part of the transmitted quantity of energy which is dependent on its distance from the first element. The energy stored in this manner is then emitted in the form of electromagnetic waves at the frequency of the LC-oscillating circuit of the second element. A part of this energy which is again dependent on the distance between the two elements is then transmitted back to the first element. A quantity of energy which is a measure of the distance between the two elements is generated in the first element by means of integration over a predetermined period of time. If the quantity of energy received differs from an expected quantity of energy, a state is assumed in which operation of the corresponding system is not allowed.

EP 1 278 077 A2 discloses the general principle of an inductive proximity sensor which does not depend on an appropriately designed counterpart (transmitting/receiving element). However, the sensor does not have the protection against manipulation required for use in safety technology.

Against this background, an object of the present invention is to show a cost-effective device and a method for securely monitoring a distance between a metallic part and an inductive proximity sensor even if the approach of different metals needs to be taken into account. In this case, the intention is to be able, in particular, to protect against manipulation in a manner which ensures compliance with a minimum distance and allows the same minimum distance for different metals.

SUMMARY OF THE INVENTION

According to one aspect of the invention, there is provided a method of the type mentioned at the outset, said method having the following steps of:

providing an oscillating circuit, providing a metallic part made of a first material, driving the oscillating circuit with at least one pulse, such that a decaying oscillation is generated which is dependent on a distance between the metallic part and the oscillating circuit and which has an actual frequency and an actual attenuation, and signaling whether both the actual frequency undershoots a predefined maximum frequency and the actual attenuation undershoots a predefined maximum attenuation.

According to a further aspect of the invention, there is provided a device of the type mentioned at the outset, said device having an oscillating circuit, a metallic part made of a first material and a pulse generator for driving the oscillating circuit with at least one pulse in order to generate a decaying oscillation which is dependent on a distance between the metallic part and the oscillating circuit and has an actual frequency and an actual attenuation, and also having a signal transmitter which is designed to signal when both the actual frequency undershoots a predefined maximum frequency and the actual attenuation undershoots a predefined maximum attenuation.

A special feature of the invention can be seen in the fact that it is possible to protect against manipulation in a simple manner despite the different characteristics of ferromagnetic and non-ferromagnetic materials and mixtures of these materials.

The invention comprises comparing both the actual frequency of the decaying oscillation with a predefined maximum frequency and the actual attenuation with a predefined maximum attenuation. This makes it possible to detect the required minimum distance between a metal and the oscillating circuit, in particular the oscillating circuit of a proximity sensor.

Although the invention also allows the type of approaching metal to be detected and also allows a numerical value for the distance to be provided, the minimum distance which acts as protection against manipulation can also be monitored without specific knowledge of this information.

This is based on the insight that checking the actual frequency and the actual attenuation makes it possible, in a simple manner, to protect against manipulation both for ferromagnetic metals and for non-ferromagnetic metals. This also applies to a plurality of metals having a mixture of ferromagnetic and non-ferromagnetic components. The principle of this approach is explained in more detail using the exemplary embodiments.

In addition to the application in a guard door described above, a corresponding method and a corresponding device may also be advantageously used in a press. If the activation of a press is intended to be possible only from a particular position, it is possible to determine, in the manner described above, whether the position required for operation has been reached. For example, it is possible to detect whether an actuating cam which is assigned to the drive of the press is at a particular position or is within a particular range of angles. Only in this case will the press be enabled for operation.

One refinement of the invention signals whether the actual frequency undershoots a predefined minimum frequency and/or the actual attenuation also undershoots a predefined minimum attenuation.

In addition to the required protection against manipulation, this also makes it possible to monitor whether the metallic part is sufficiently close to the oscillating circuit. This means, for the application of the guard door, that a closed guard door or an open guard door can be detected, but manipulation by virtue of a metal part being applied to the proximity sensor is detected at the same time. The same applies to the application of the actuating cam, in which case it is also possible to determine here whether the cam is actually in the vicinity of the proximity sensor, or else an overlying metal part is detected.

The signaling may be effected in different ways. It is possible, on the one hand, to indicate the exceeding of the minimum frequency and the minimum attenuation independently of the undershooting of the maximum frequency and the maximum attenuation, for example by transmitting two or three bits. However, combined signaling is likewise possible. Then, an overall indication is given of whether the actual frequency undershoots a predefined maximum frequency, the actual attenuation undershoots a predefined maximum attenuation and of whether the actual frequency exceeds a predefined minimum frequency and/or the actual attenuation exceeds a predefined minimum attenuation. Such a combined signal is sufficient in many applications since, in order to avoid switching on a system or to switch off a system, it may be sufficient to know that one of the required safety conditions has been violated, but the specific safety condition which has been violated may initially be unimportant.

In another refinement of the invention which is also per se an inventive development of the known method and the known device, a data record is provided which represents a first correlation between the frequency and the attenuation when the metallic part approaches, and the signaling indicates whether the actual frequency and the actual attenuation correspond to the first correlation.

This embodiment, which is also functional without a comparison with a maximum frequency and a maximum attenuation, is based on the insight that metallic parts made of different materials have different frequency/attenuation characteristics. For example, the frequency of the oscillating circuit scarcely changes if iron steel (ST37) approaches the oscillating circuit, whereas the attenuation changes to a considerable extent when iron steel approaches. If stainless steel (V2A) approaches, which is another example, there is a similar change in the attenuation to that for iron steel, while there is now additionally a change in the frequency. Therefore, the frequency/attenuation characteristic of stainless steel is considerably different from the characteristic of iron steel. Copper (Cu) may finally be mentioned as a further example which, although resulting in less attenuation when it approaches the oscillating circuit, results in a greater frequency change. The frequency/attenuation characteristic of copper thus again differs from the characteristics of stainless steel and iron steel.

Such a correlation between the frequency and the attenuation as a metallic part made of a particular material approaches is provided in a data record. In the simplest case, such a data record comprises a frequency/attenuation data point or the description of a straight line which can be used to determine different frequency/attenuation points. However, more complex functions or characteristic curves described using support/interpolation values can also be used to describe the correlation between the frequency and the attenuation. In this case, the data provided in the data record can be determined by means of experiments and/or computation.

When carrying out the method, if an object then approaches the proximity sensor, an actual frequency and an actual attenuation are determined for the oscillation of the oscillating circuit, and it is signaled whether the actual frequency and the actual attenuation correspond to the correlation stored in the data record. If a correspondence is determined, this allows the conclusion that the material whose characteristic is provided in the data record is approaching the proximity sensor.

On account of the knowledge that the frequency/attenuation characteristics of the different materials differ to a discernible extent, this determination can be made, as far as possible, independently of the distance. (Reliable differentiation is difficult only in the case of a large distance. However, this is not significant for the preferred applications since a large distance indicates an unsafe state anyway, for example an open guard door).

It is possible to check whether the actual frequency and the actual attenuation correspond to the stored correlation in different ways. For example, it is possible to define that a 2-tuple formed from the actual frequency and the actual attenuation may differ from the provided correlation between the frequency and the attenuation by, at most, a particular amount. If the correlation is stored, for example, in the form of a straight line or characteristic curve, the distance between the 2-tuple and the straight line or the characteristic curve can be determined using known mathematical methods. If the distance calculated undershoots the defined maximum value, this is understood to mean that the actual frequency and the actual attenuation correspond to the correlation. If the distance is greater than the maximum value, this means that they do not correspond to the correlation.

In another refinement of the invention, the data record describes a distance between the metallic part and the oscillating circuit, which distance is dependent on the frequency and attenuation, and a distance value is determined on the basis of the actual frequency and the actual attenuation.

This is based on the insight that a particular frequency/attenuation value (2-tuple of frequency and attenuation) also allows an immediate conclusion regarding the distance value of the metallic part with respect to the proximity sensor. Although a conclusion regarding the material of the approaching object can also be drawn from the frequency/attenuation value, it is possible, on account of the different frequency/attenuation characteristics, to determine a distance value without having to evaluate material information for this purpose. A distance value can therefore be directly determined when the actual frequency and the actual attenuation are known.

The distance value is determined in such a manner that the corresponding distance is determined in the data record for a given actual frequency and actual attenuation. This may again be carried out, for example, in such a manner that that value of the data record which has the smallest distance from the measured 2-tuple in the mathematical sense is used.

As a further alternative, it is possible to determine the two closest values and to interpolate or extrapolate the distance value between these two values. This also makes it possible to directly assign a distance value to a measured 2-tuple of the actual frequency and the actual attenuation.

Another refinement of the invention signals whether the distance value exceeds a minimum distance value and/or undershoots a maximum distance value.

It is possible to protect against manipulation by taking into account a minimum distance value, and/or a sufficient proximity of the metallic part can be determined by taking into account a maximum distance value.

In another refinement of the invention, the data record represents a second correlation between the frequency and the attenuation when a metallic part made of a second material that is different from the first material is approaching the oscillating circuit, and it is signaled whether the actual frequency and the actual attenuation correspond to the second correlation.

The statements above accordingly apply to this embodiment. However, storing a second correlation now makes it possible to detect at least three states:
  a) an object which corresponds to the first correlation and thus to the first material is approaching;
  b) an object which corresponds to the second correlation and thus to the second material is approaching;
  c) an object which does not correspond to the first correlation or the second correlation and thus does not correspond to the first material or the second material is approaching.

Concerning the type of implementation, again, many possibilities arise. The information determined can be respectively signaled individually, can be signaled in groups, each group also being able to contain logic combinations of different information, or else can be output in the form of an overall signal. The overall signal may indicate, for example, whether, in addition to complying with the predefined minimum/maximum values, the condition that the approaching object be composed of either the first material or the second material has also been satisfied.

Alternatively, it is possible to output a signal at a first level, for example when all conditions have been satisfied, whereas a signal at a second level is output when at least one of the conditions has not been satisfied. This is advantageous for safety technology since it is then possible to signal in a simple manner whether or not all safety-relevant conditions for operation of the system have been satisfied.

In another refinement of the invention, it is signaled to which of the correlations stored in the data record the actual frequency and the actual attenuation correspond.

This makes it possible to additionally provide the information relating to the material of which the object is composed or the material which is predominantly contained in the object which is approaching the proximity sensor.

In this case, the material can be determined by checking which of the correlations stored in the data record the 2-tuple of the actual frequency and the actual attenuation best corresponds to. In this case, correspondence can be determined as described above, for example the correlation from which the 2-tuple has the smallest distance. Further queries, for example in order to determine whether the 2-tuple exceeds a maximum permitted distance from the closest correlation, may additionally be implemented, with the result that fault handling is also possible.

In another refinement of the invention, the data record stores at least one further correlation for a further material, and it is signaled whether the actual frequency and the actual attenuation correspond to a correlation from a particular group of correlations.

This makes it possible to define, for example, a group of materials which are intended to give rise to particular signaling. For example, the correlations for iron steel, stainless steel, aluminum (Al) and copper may thus be stored, wherein a group consisting of iron steel and copper and a group consisting of stainless steel and aluminum are defined. In the proposed embodiment, it is then possible to signal, inter alia, whether the 2-tuple corresponds to the group of stainless steel and aluminum or whether the material of an approaching object is stainless steel or aluminum.

In another refinement of the invention, the method is carried out twice, and a fault is signaled if there is a difference in the respective resultant signaling.

In order to reduce the likelihood of a system being enabled for operation even though the safety-relevant conditions have not been satisfied as a result of a fault when carrying out the method or as a result of a fault in the signaling device, it is advantageous to secure the method and the signaling device using redundancy. This may be achieved, for example, by running through the method twice at short intervals of time.

However, it is preferred to carry out the method in two different parts of the signaling device which are essentially of the same design. In this case, it is assumed that the first operation of carrying out the method (in the first part of the device) and the second operation of carrying out the method (in the second part of the device) must lead to the same result.

The result of the first signaling device and the result of the second signaling device are then passed to a comparison unit which compares the two result signals. If the result signals do not match, a malfunction is assumed and a fault is signaled.

The fault may be indicated as a separate signal or a combined signal. For example, a signal at a first level can be used to indicate that all safety-relevant conditions have been satisfied and that there is no fault, whereas a signal at a second level is used to indicate that at least one of the safety-relevant conditions has not been satisfied or that there is a fault. This makes it possible to signal release or non-release of the system in a simple manner.

It goes without saying that the abovementioned features and the features still to be explained below can be used not only in the respective combination stated but also in other combinations or on their own without departing from the scope of the present invention.

BRIEF DESCRIPTION OF THE DRAWINGS

Exemplary embodiments of the invention are illustrated in the drawing and are explained in more detail in the following description. In the drawing:

FIG. 6 shows the illustration according to FIG. 4 with dedicated permitted ranges.

DESCRIPTION OF PREFERRED EMBODIMENTS

Figure 1:
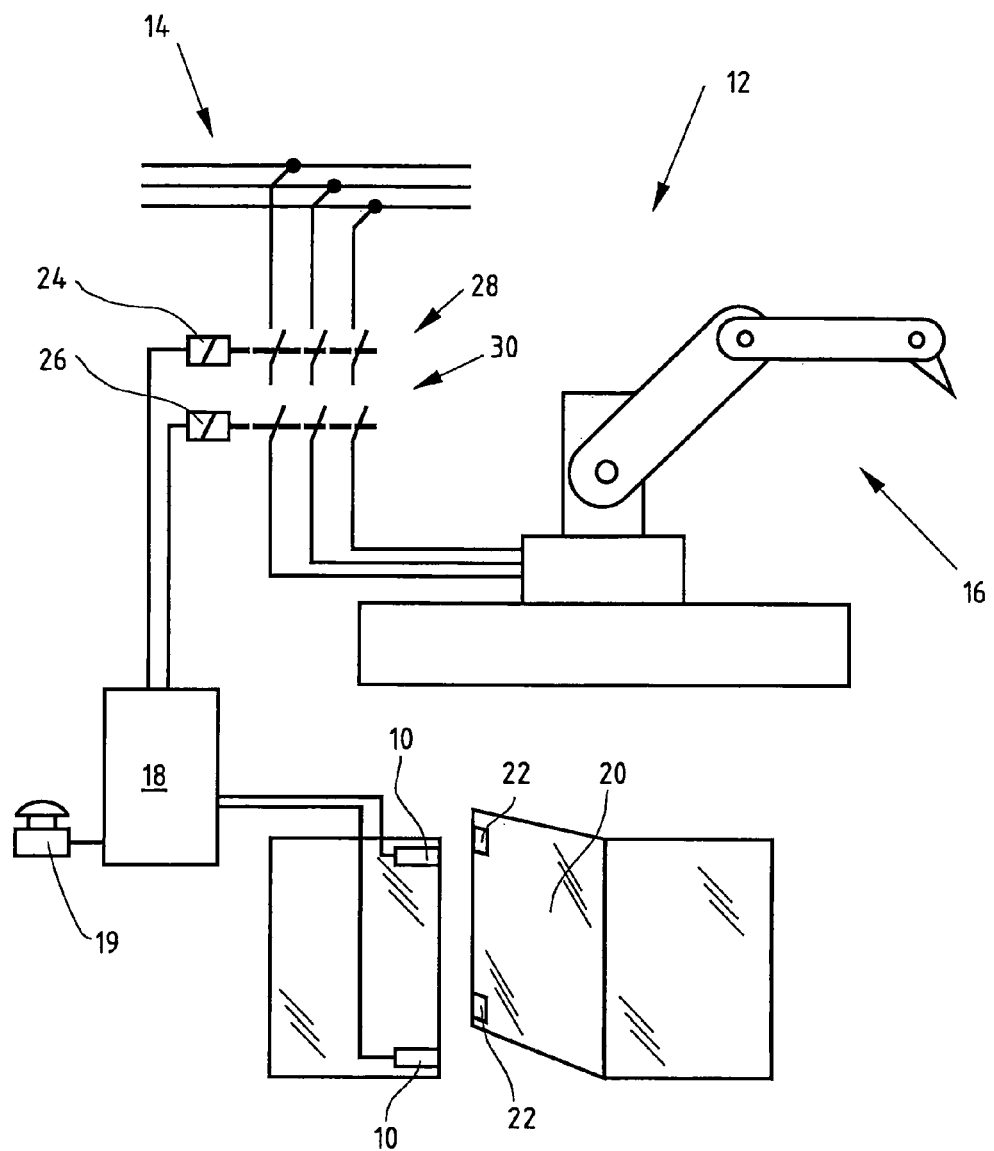
FIG. 1 shows a set-up having a signaling device according to the present invention.

FIG. 1 uses the reference number 12 to denote an entire set-up having the novel signaling device 10. In this case, the set-up 12 comprises a power supply 14, a machine 16 and two signaling devices 10 which are connected to a control unit 18. In this case, the signaling devices 10 are constructed according to the principle of an inductive proximity sensor. In general, it is sufficient to use one signaling device 10.

The machine 16 can be switched on only when the two signaling devices 10 signal a release. The signaling devices 10 indicate whether each of the metallic parts 22 which are arranged on the guard door 20 are in a defined distance range with respect to their respectively associated signaling device 10. In this case, monitoring is carried out to ensure that the metallic parts 22 comply with a minimum distance with respect to the respective signaling device 10 but at the same time also do not exceed a particular maximum distance. Of course, a metallic guard door 20 may also itself perform the function of the metallic parts 22, with the result that there is no need for separate parts 22.

If the two signaling devices 10 indicate that the guard door 20 has been closed correctly and thus that the machine 16 is allowed to be started, the control unit 18 drives two contactors 24, 26 whose normally open contacts 28, 30 are arranged in the connection between the power supply 14 and the machine 16. The machine 16 can carry out the operation only when both contactors 24, 26 close their respective normally open contacts 28, 30.

In an alternative embodiment which is schematically indicated here, a start button 19, which may be connected to the control unit 18, also needs to be operated in order to switch on the machine 16 when the guard door 20 is closed.

If one of the two signaling devices 10 no longer indicates the release for the system 16, for example because the guard door 20 was opened during operation, the control unit 18 lets the contactors 24, 26 drop. It is also conceivable to assign a contactor 24, 26 to each of the signaling devices 10, with the result that, when there is no release from one of the signaling devices 10, the associated contactor 24, 26 deliberately drops. In any case, the machine 16 thereby becomes deenergized.

Figure 2:
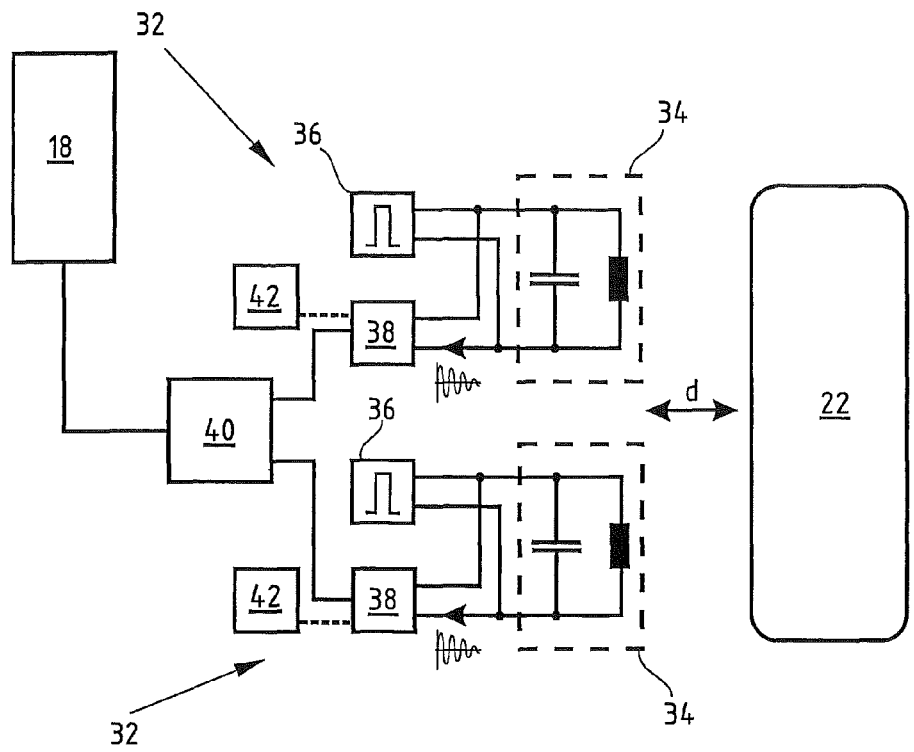
FIG. 2 shows a two-channel signaling device which is connected to a control unit.

FIG. 2 shows, in detail, one of the signaling devices 10 which is of redundant design in this case. The signaling device 10 has two modules 32 which are essentially structurally identical and each have an oscillating circuit 34, a pulse generator 36 and a signal transmitter 38. In this exemplary embodiment, each oscillating circuit 34 has a capacitor and a coil. It is pointed out that the pulse generator 36 is depicted separately from the signal transmitter 38 for the sake of a better overall view but the pulse generator 36 may also be integrated with the signal transmitter 38.

The outputs from the signal transmitters 38 are passed to a comparison unit 40 which is designed to compare the signals from the signal transmitters 38 and to signal a fault if the signals do not match. The output signal from the comparison unit 40 is passed to the control unit 18 and is evaluated therein. The signaling device 10 is also assigned a metallic part 22 made of a first material. The signal transmitters 38 are each assigned a memory 42 which stores correlations between the frequency and the attenuation for different materials when a metallic part 22 approaches the signaling device 10. The dashed line indicates that the memory 42 is optional.

It is pointed out that the signaling device 10 may also be constructed with only one oscillating circuit 34, which is then tapped off by the two comparison units 40, in particular in order to save space.

The method of operation of the signaling device 10 shall first of all be explained using the implementation of protection against manipulation. Since the modules 32 have the same functionality, the explanation now refers to one of the modules 32.

The pulse generator 36 sends a pulse to the oscillating circuit 34. The pulse produces a decaying oscillation having an actual frequency and an actual attenuation in the oscillating circuit 34. In this case, the actual frequency and the actual attenuation are dependent both on the distance d between the metallic part 22 and the signaling device 10 and on the material of the metallic part 22.

The actual frequency and the actual attenuation are determined and are compared with a predefined maximum frequency and a predefined maximum attenuation. The signal transmitter 38 may provide a corresponding measuring and comparison device (not illustrated in any more detail here) for this purpose.

If both the actual frequency undershoots the maximum frequency and the actual attenuation undershoots the maximum attenuation, the signal transmitter 38 generates a release signal which is passed to the comparison unit 40.

If the comparison unit 40 receives a release signal from both modules 32, it sends a release signal to the control unit 18. If one of the two signal transmitters 38 does not send a release signal, the comparison unit 40 does not send a release signal either. This behavior thus simultaneously safeguards the fault situation in case the signal transmitters 38 send different signals.

In the exemplary embodiment shown here, the signaling device 10 additionally monitors whether the actual frequency exceeds a predefined minimum frequency and the actual attenuation exceeds a predefined minimum attenuation. If this is not the case, the signal transmitter 38 does not send a release signal.

Further monitoring options which result from including the optional memory 42 are explained in even more detail below.

Figure 3:
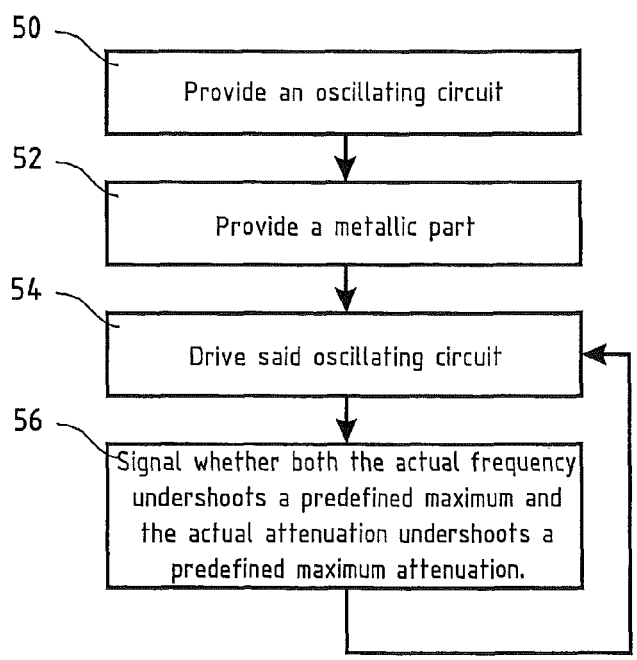
FIG. 3 shows the sequence of a method according to the invention in the representation of a flow diagram.

FIG. 3 shows the sequence of a method according to the invention. In this case, an oscillating circuit 34 is provided in a first step 50 and a metallic part 22 made of a first material is provided in a second step 52. In a step 54, the oscillating circuit 34 is then driven with a pulse, thereby producing a decaying oscillation which is dependent on a distance d between the metallic part 22 and the oscillating circuit 34 and has an actual frequency and an actual attenuation. A step 56 then signals whether both the actual frequency undershoots a predefined maximum frequency and the actual attenuation undershoots a predefined maximum attenuation. The method is then continued again with step 54.

Figure 4:
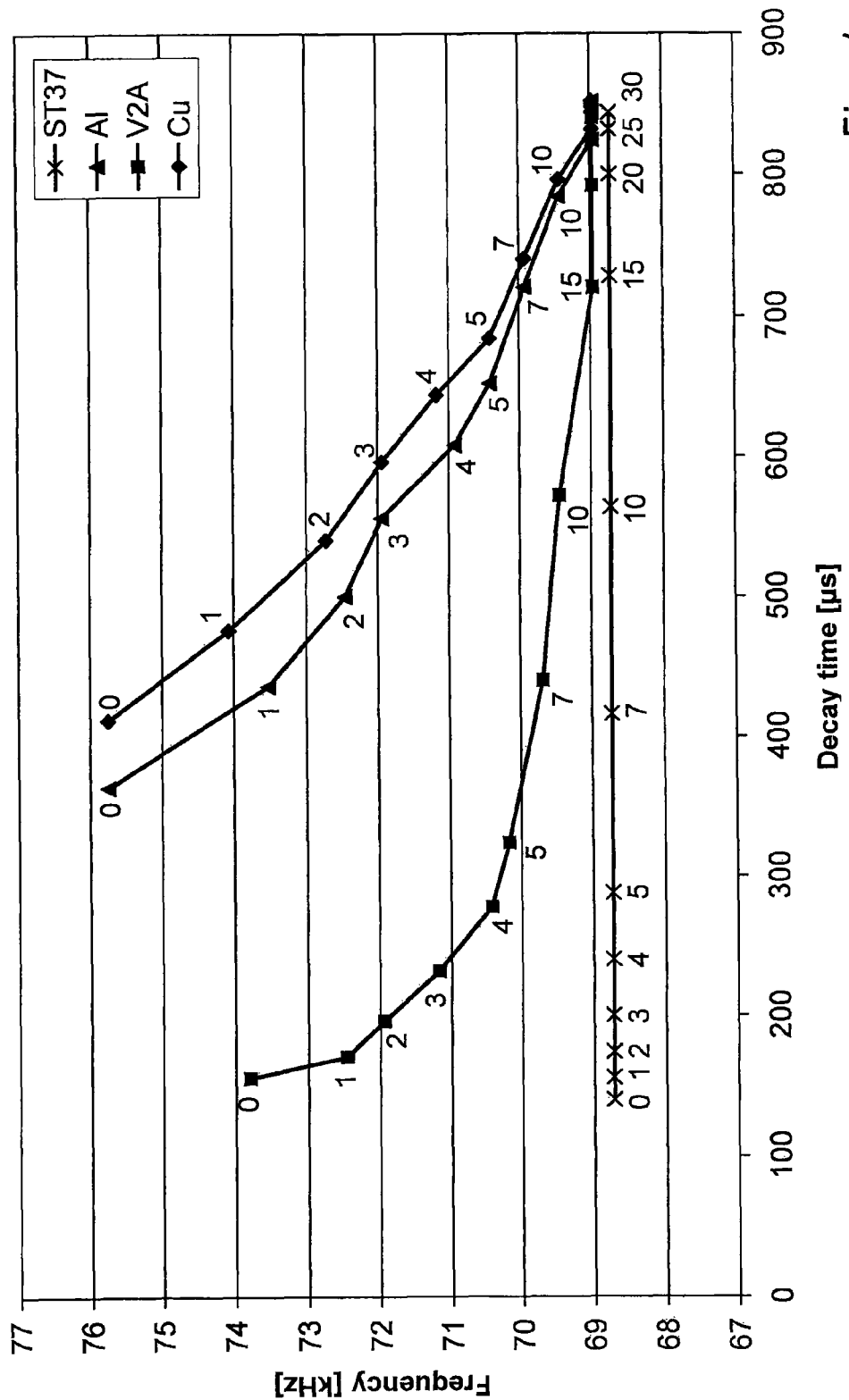
FIG. 4 shows frequency/attenuation characteristics with associated distance values for different materials.

FIG. 4 illustrates the fundamental insight used by the invention for secure distance monitoring. A decay time of the oscillation generated in the oscillating circuit 34 is illustrated along the abscissa. The decay time is the time which passes, after the pulse has been sent to the oscillating circuit 34, until the maximum amplitude of the oscillation has decreased to a particular percentage, for example 10%, on account of the electrical losses. The decay time is therefore a measure of the attenuation. The shorter the decay time, the greater the attenuation, and the longer the decay time, the smaller the attenuation.

The frequency of the oscillation in the oscillating circuit 34 is plotted along the ordinate.

FIG. 4 illustrates correlations between the frequency and the attenuation (decay time) for iron steel (ST37), stainless steel (V2A), aluminum (Al) and copper (Cu). A characteristic curve representation with support/interpolation values was selected in this case, but the characteristic curves may also be approximated by means of simple functions, for example a linear function or exponential function.

By way of example, it can be seen from FIG. 4 that, for an actual frequency of approximately 72 kHz and an actual attenuation represented by a decay time of approximately 200 µs, it is possible to infer stainless steel at a distance of 2 mm or, for a frequency of approximately 74 kHz and an actual attenuation represented by a decay time of approximately 475 µs, it is possible to infer a metallic part 22 made of copper at a distance of 1 mm. It is thus possible to infer the material of the metallic part 22 and/or the distance d between the latter and the oscillating circuit 34 from a 2-tuple of the actual frequency and the actual attenuation.

Figure 5:
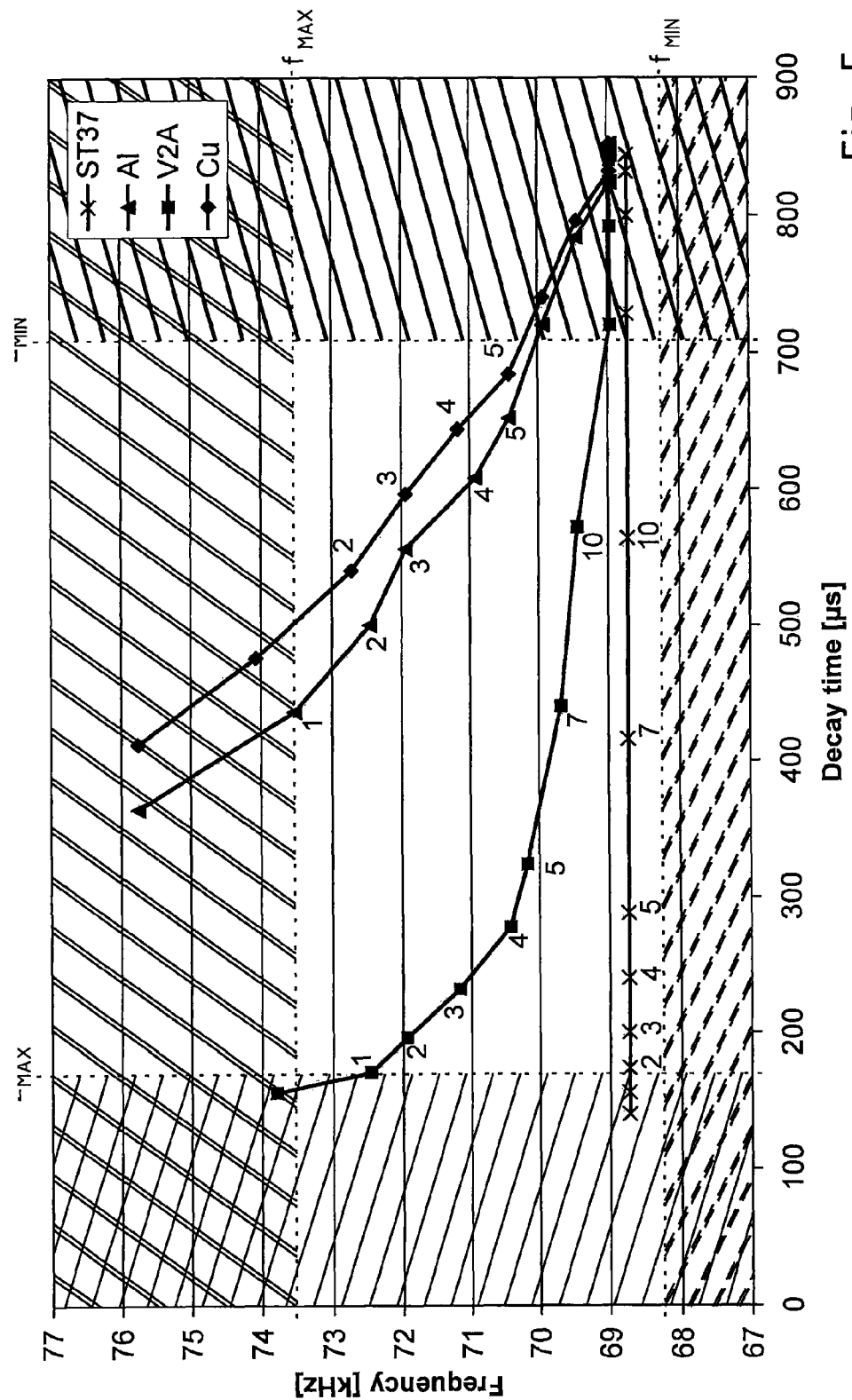
FIG. 5 shows the illustration according to FIG. 4 with the minimum and maximum values depicted.

FIG. 5 shows an embodiment which affords simple and reliable protection against manipulation even without a correlation between the frequency and the attenuation, which is stored in a data record.

In order to illustrate the protection against manipulation, reference is first of all made to the maximum frequency $f_{MAX}$ of approximately 73.5 kHz and to the maximum attenuation $Z_{MAX}$ represented by a minimum decay time of approximately 175 µs. The range which exceeds the maximum frequency $f_{MAX}$ is illustrated using double hatching. The range which exceeds the maximum attenuation $Z_{MAX}$ is illustrated using thin single hatching.

Since both the actual frequency and the actual attenuation of the oscillation in the oscillating circuit 34 are checked, this means that a release signal is not generated if any desired material of the possible materials is at a distance of less than 1 mm from the oscillating circuit 34.

It is expressly stated at this point that the diagram for particular 2-tuples of the actual frequency and the actual attenuation shows a correspondence to a material and a distance value but that there is no need to obtain or evaluate this information in order to protect against manipulation. Rather, evaluation of the actual frequency and the actual attenuation with respect to the respective maximum value is sufficient without the need to take into account the associated material or distance.

A special feature of the proposed protection against manipulation is that it is simple to implement and nevertheless works reliably with a plurality of different materials, in particular ferromagnetic and non-ferromagnetic materials.

This is also a flexible solution since the range detected by the protection against manipulation can be varied by simply varying the maximum frequency $f_{MAX}$ and the maximum attenuation $Z_{MAX}$. If, for example, the maximum frequency $f_{MAX}$ is predefined at approximately 72.5 kHz and the maximum attenuation $Z_{MAX}$ is predefined by a decay time of approximately 190 µs, a minimum distance of approximately 2 mm is defined for all possible metals.

A maximum distance can be monitored in a similar manner. For this purpose, a minimum attenuation $Z_{MIN}$ is predefined in the form of a maximum decay time. The range excluded by this stipulation is illustrated using thick single hatching. If necessary, a minimum frequency $f_{MIN}$ may also be defined. The resultant range is illustrated using the dashed double hatching.

It goes without saying, however, that a statement relating to the material and/or the distance can also be made in this embodiment if the memory 42 stores the corresponding correlations. However, it is pointed out again that both the minimum distance needed to protect against manipulation and the maximum permissible distance can be implemented solely by comparing the actual frequency and the actual attenuation with respectively associated minimum/maximum values.

FIG. 6 shows an embodiment in which only specific materials with specific distances are allowed in order to obtain a release signal. In this embodiment, the correlations for selected materials are stored in a data record, particular ranges being defined as permissible (not hatched) and other ranges being defined as impermissible (hatched) by means of an appropriate checking algorithm. The settings were made in this example in such a manner that a release signal is issued when a metallic part 22 made of stainless steel or copper has approached in the range of approximately 1 mm to 5 mm, whereas a release signal is not sent in other distance ranges or for other materials. It is also possible to respectively specify the material which has been detected and the distance value on the basis of the data stored in the data record.

However, on account of the known correlation between the frequency and the attenuation, which can be determined by computation and/or experiments, it is also possible to dispense with storing material information and/or distance information since a query in order to determine whether a particular 2-tuple of the actual frequency and the actual attenuation is in a permissible range is sufficient.

It goes without saying that more complex forms may also be used to describe the permissible and impermissible ranges, or only sections of characteristic curves are stored. The ranges may also be described, in particular, as functions by means of formulas and may be provided with a tolerance band.

Overall, the invention shows a simple and reliable concept for constructing and operating a signaling device with protection against manipulation. Furthermore, the invention enables a comprehensive definition of permissible and impermissible states, that is to say those states in which a release signal is or is not generated. In this case, it is possible to define the same minimum distance for different materials in a simple manner or else to provide for a release signal to be generated when there is no distance value for particular materials. It is possible to both explicitly include and explicitly exclude particular materials in/from the detection. In addition to the simple implementation of the fundamental idea, the invention therefore also provides a basis for implementing demanding requirements.

What is claimed is:

1. A method for securely monitoring a distance between a metallic part and an inductive proximity sensor, said method having the following steps of:
    providing an oscillating circuit,
    providing a metallic part made of a first material,
    driving the oscillating circuit with at least one pulse, such that a decaying oscillation is generated which is dependent on a distance between the metallic part and the oscillating circuit and has an actual frequency and an actual attenuation, and
    signaling whether both the actual frequency undershoots a predefined maximum frequency and the actual attenuation undershoots a predefined maximum attenuation.

2. The method of claim 1, wherein it is signaled whether the actual frequency exceeds a predefined minimum frequency and/or the actual attenuation exceeds a predefined minimum attenuation.

3. The method of claim 1, wherein a data record is provided which represents a first correlation between the frequency and the attenuation as the metallic part approaches, and the signaling indicates whether the actual frequency and the actual attenuation correspond to the first correlation.

4. The method of claim 3, wherein the data record describes a distance between the metallic part and the oscillating circuit, which distance is dependent on the frequency and attenuation, and a distance value is determined on the basis of the actual frequency and the actual attenuation.

5. The method of claim 4, wherein it is signaled whether the distance value exceeds a minimum distance value and/or undershoots a maximum distance value.

6. The method of claim 3, wherein the data record represents a second correlation between the frequency and the attenuation when a metallic part made of a second material, that is different from the first material, approaches the oscillating circuit, and in that it is signaled whether the actual frequency and the attenuation correspond to the second correlation.

7. The method of claim 6, wherein it is signaled to which of the correlations stored in the data record the actual frequency and the actual attenuation correspond.

8. The method of claim 6, wherein the data record stores at least one further correlation for a further material, and it is signaled whether the actual frequency and the actual attenuation correspond to a correlation from a particular group of correlations.

9. The method of claims 1, wherein the method is carried out twice, and in that a fault is signaled if there is a difference in the respective resultant signaling.

10. A signaling device for securely monitoring a distance between a metallic part and an inductive proximity sensor, said device having an oscillating circuit, an associated metallic part made of a first material and a pulse generator for driving the oscillating circuit with at least one pulse in order to generate a decaying oscillation which is dependent on a distance between the metallic part and the oscillating circuit and which has an actual frequency and an actual attenuation, and also having a signal transmitter which is designed to signal when both the actual frequency undershoots a predefined maximum frequency and the actual attenuation undershoots a predefined maximum attenuation.

11. The signaling device of claim 10, further comprising a memory which stores a first correlation between the frequency and the attenuation as the metallic part approaches, and the signal transmitter is designed to signal whether the actual frequency and the actual attenuation correspond to the first correlation.

12. The signaling device of claim 10, wherein the signaling device is of redundant design by means of a further oscillating circuit and a further signal transmitter and has a comparison unit for comparing the signals from the signal transmitters and for signaling a fault if said signals do not match.

* * * * *